United States Patent [19]
Mehta

[11] Patent Number: 5,619,072
[45] Date of Patent: Apr. 8, 1997

[54] HIGH DENSITY MULTI-LEVEL METALLIZATION AND INTERCONNECTION STRUCTURE

[75] Inventor: Sunil Mehta, San Jose, Calif.

[73] Assignee: Advanced Micro Devices, Inc., Sunnyvale, Calif.

[21] Appl. No.: 601,541

[22] Filed: Feb. 14, 1996

Related U.S. Application Data

[63] Continuation of Ser. No. 387,044, Feb. 9, 1995, abandoned.

[51] Int. Cl.⁶ .............. H01L 23/48; H01L 29/44; H01L 29/52; H01L 29/62
[52] U.S. Cl. .............. 257/774; 257/763; 257/768; 257/760; 257/900
[58] Field of Search ................ 257/774, 784, 257/748, 763, 764, 768, 760, 900, 752, 347, 330

[56] References Cited

U.S. PATENT DOCUMENTS

| | | | |
|---|---|---|---|
| 3,841,031 | 10/1974 | Walsh | 451/41 |
| 3,911,562 | 10/1975 | Youmans | 257/517 |
| 4,193,226 | 3/1980 | Gill, Jr. et al. | 451/276 |
| 4,394,678 | 7/1983 | Winchell, II et al. | 257/764 |
| 4,811,522 | 3/1989 | Gill, Jr. | 451/285 |
| 4,859,630 | 8/1989 | Josquin | 257/382 |
| 4,916,521 | 4/1990 | Yoshikawa et al. | 257/774 |
| 4,944,836 | 7/1990 | Beyer et al. | 156/645.1 |
| 5,014,109 | 5/1991 | Higuchi | 257/774 |
| 5,233,223 | 8/1993 | Murayama | 257/748 |
| 5,236,870 | 8/1993 | Sakata et al. | 437/195 |
| 5,243,220 | 9/1993 | Shibata et al. | 257/774 |
| 5,245,794 | 9/1993 | Salugsugan | 451/287 |
| 5,334,862 | 8/1994 | Manning et al. | 257/347 |
| 5,462,893 | 10/1995 | Matsuoka et al. | 437/195 |

FOREIGN PATENT DOCUMENTS

| | | | |
|---|---|---|---|
| 0057975 | 10/1979 | Japan | 257/784 |
| 0089541 | 4/1989 | Japan | 257/774 |
| 0053272 | 2/1992 | Japan | 257/764 |
| 6-13470 | 1/1994 | Japan | |

OTHER PUBLICATIONS

I.B.M. Technical Disclosure Bulletin, vol. 32 No. 6B Nov. 1989 "Low Sheet Resistance Gate Electrode with Conventional Bord-rless Contarts" pp. 122 +123.

"Silicon Processing for the VLSI Era," Wolf, Lattice Press, 1990, vol. 2, pp. 124–128, 192–199, 212–217, 229–233, 268–273.

*Primary Examiner*—Robert P. Limanek
*Assistant Examiner*—Alexander Oscar Williams

[57] ABSTRACT

Increased densification in a semiconductor chip is provided by a negative enclosure of a conductive via utilizing an etch stop insulating material.

11 Claims, 3 Drawing Sheets

HIGH DENSITY MULTI-LEVEL METALLIZATION AND INTERCONNECTION STRUCTURE

This application is a continuation of application Ser. No. 08/387,044 filed Feb. 9, 1995, now abandoned.

TECHNICAL FIELD

The present invention relates to a semiconductor device containing an interconnection structure comprising conductive wiring and a conductive via on a substrate, and to a method for forming an interconnection structure. The invention has particular application in submicron circuit manufacturing.

BACKGROUND ART

The escalating requirements for density and performance associated with ultra large scale integration semiconductor wiring require responsive changes in interconnection technology, which is considered one of the most demanding aspects of ultra large scale integration technology. High density demands for ultra large scale integration semiconductor wiring require planarized layers with minimal spacing between conductive wiring lines.

A traditional method for forming interconnection structures comprises forming a through-hole to expose underlying conductive material of a conductive wiring pattern on a lower level of a semiconductor device, wherein the wiring pattern serves as a landing pad occupying the entire bottom surface portion of the through-hole. Upon filling the through-hole with conductive material to form a conductive via, the entire bottom surface of the conductive via is in direct contact with the conductive pattern. Such a conventional technique is illustrated in FIGS. 1A and 1B, wherein conductive pattern 10 formed on first insulating layer 15 is exposed by through-hole 12 formed in second insulating layer 11. In accordance with conventional practices, through-hole 12 is formed in such a way that conductive pattern 10 occupies its entire bottom surface and encloses it thereby serving as a landing pad for conductive material 13 which fills the through-hole 12 to form conductive via 16 electrically connecting upper conductive wiring pattern 10a to lower conductive wiring pattern 10. As shown in FIGS. 1A and 1B, lower conductive wiring pattern 10 extends beyond the bottom contact surface by a distance 14. Thus, the entire bottom surface of conductive via 16 is in direct contact with conductive pattern 10.

A problem attendant upon such a conventional landing pad practice of completely enclosing the bottom surface of the conductive via with the conductive pattern is use of a significant amount of precious real estate on a semiconductor chip with conductive material, which is antithetic to escalating high densification requirements.

DISCLOSURE OF THE INVENTION

An object of the present invention is a multi-level semiconductor device having an interconnection structure with increased densification.

Another object of the invention is an improved method of manufacturing a multi-level semiconductor device comprising an interconnection structure with increased densification.

Additional objects, advantages and other features of the invention will be set forth in part in the description which follows and in part will become apparent to those having ordinary skill in the art upon examination of the following or may be learned from practice of the invention. The objects and advantages of the invention may be realized and obtained as particularly pointed out in the appended claims.

According to the present invention, the foregoing and other objects are achieved in part by a multi-level semiconductor device comprising: a substrate; a plurality of insulating layers forming levels on the substrate; conductive wiring on at least one level; and at least one conductive via comprising a through-hole containing conductive material, the conductive via comprising a bottom surface and extending between an upper level and a lower level; wherein the bottom surface of the conductive via is in direct contact with conductive wiring in the lower level and with an etch stop insulating material.

Another aspect of the invention is a method of manufacturing a multi-level semiconductor device comprising: forming a first insulating layer on a substrate; forming conductive wiring having an upper surface and sidewalls on the first insulating layer; depositing an etch stop insulating material on at least a portion of the sidewalls of the conductive wiring; forming a second insulating layer on the conductive wiring and etch stop insulating material; forming a through-hole between the first and second insulating layers to expose a portion of the conductive wiring and a portion of the etch stop insulating material; and filling the through-hole with conductive material to form a conductive via having a bottom surface, so that the bottom surface of the conductive via is in direct contact with the conductive wiring and with the etch stop insulating material.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1A:
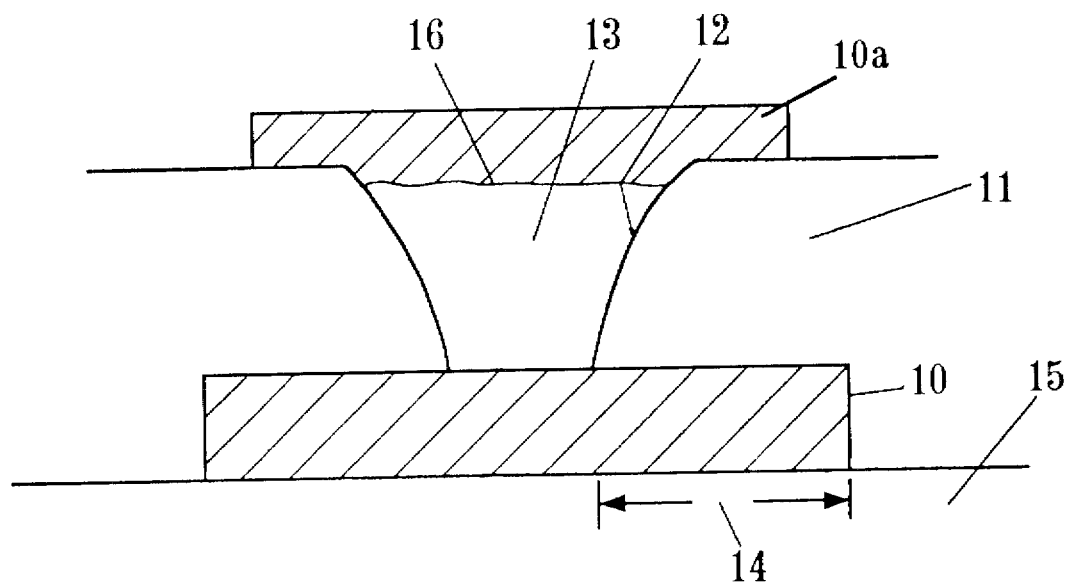
FIGS. 1A and 1B illustrate a cross-section and top view, respectively, of a conventional interconnection comprising a conductive via and conductive wiring.
Figure 1B:
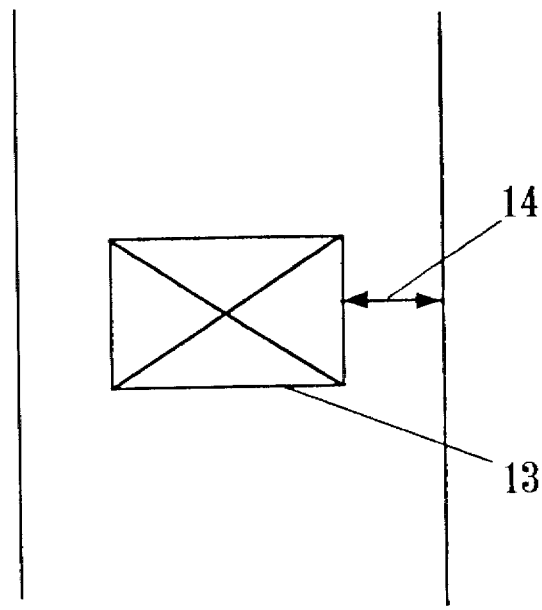

In order to increase densification consistent with the requirements of ultra large scale integration, the amount of conductive wiring occupying a level of a semiconductor device must be reduced. However, conventional techniques for manufacturing a semiconductor device comprise forming a conductive landing pad or complete conductive enclosure of a through-hole in which a conductive via is formed as illustrated in FIGS. 1A and 1B. The present invention addresses the problem of increasing the availability of real estate on a semiconductor chip by avoiding the conventional practice of providing a conductive landing pad or complete conductive enclosure of a through-hole in which a conductive via is formed. Thus, the present invention departs from conventional wisdom by providing a negative conductive enclosure of a through-hole in which a conductive via is formed, i.e., the conductive wiring does not completely enclose the bottom of the through-hole in which the conductive via is formed and, hence, the entire bottom surface of the conductive via is not in direct contact with conductive wiring.

Figure 2:
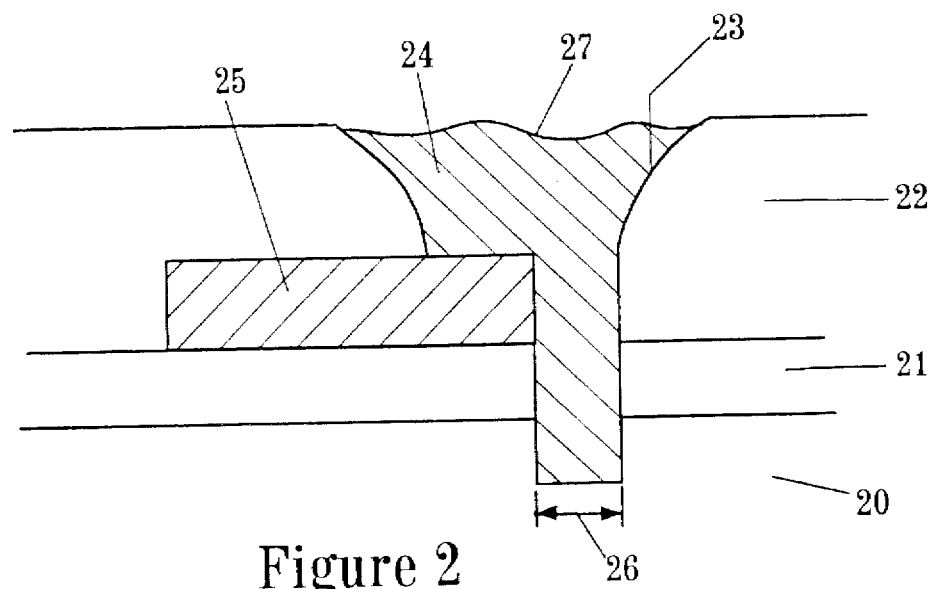
FIG. 2 illustrates the effect of a negative enclosure.

I found, however, that effective utilization of semiconductor chip real estate requires more than merely reducing the amount or dimensions of the conductive wiring pattern. For example, I experimented by forming a negative enclosure interconnection pattern wherein the entire bottom surface of a conductive via is not in direct contact with the conductive wiring. As illustrated in FIG. 2, first insulating layer 21 is formed on the substrate 20, and a conductive pattern comprising conductive wiring 25 is formed on first insulating layer 21. Second insulating layer 22 is formed on first insulating layer 21 and conductive wiring 25. A through-hole 23 is formed between first insulating layer 21 and second insulating layer 22 so that conductive wiring 25 forms a negative enclosure in that the entire bottom portion of the through-hole is not occupied by conductive wiring 25. Upon filling through-hole 23 with conductive material 24, such as tungsten, to form conductive via 27, conductive material 25, having a width 26, penetrated through to substrate 20 causing a short. It is, therefore, apparent that the solution to the densification problem is, therefore, more complex than simply reducing the amount of conductive wiring to increase the semiconductor chip area available for densification.

After extensive experimentation and investigation, I discovered that a negative conductive enclosure of a conductive via can be employed, thereby conserving precious chip real estate, by providing an etch stop insulating material at least adjacent to at least a portion of the sidewalls of the conductive wiring under a through-hole. The etch stop insulating material occupies a portion of the bottom surface of the conductive via which is not occupied by the conductive wiring, thereby preventing penetration of the underlying substrate by the conductive filling material and, hence, shorting.

Figure 3:
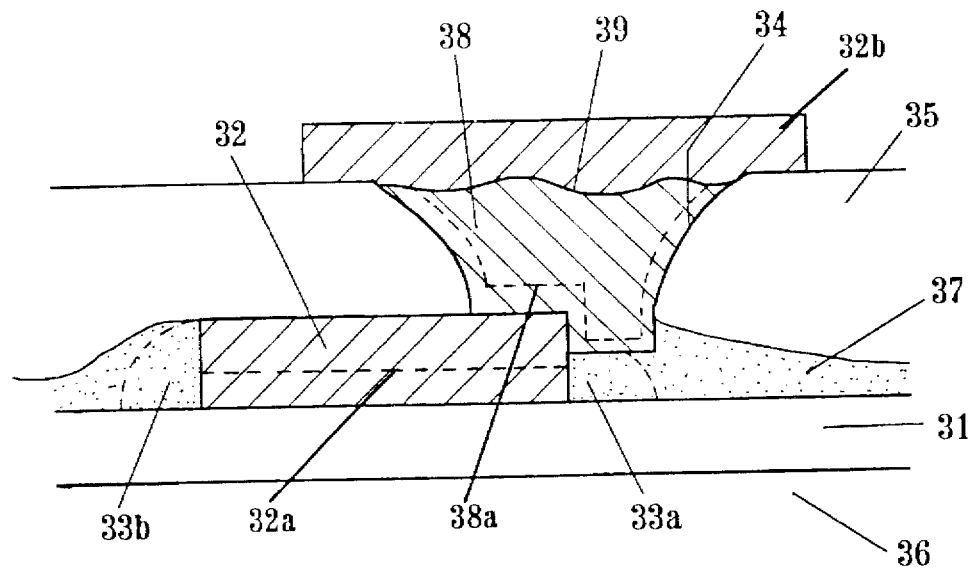
FIG. 3 depicts a negative enclosure in accordance with the present invention.

According to an embodiment of the present invention shown in FIG. 3, first insulating layer 31 is formed on substrate 36, and a conductive pattern comprising conductive wiring 32 is formed on first or lower insulating layer 31. An etch stop insulating interlayer 37 is formed adjacent the sidewalls of conductive wiring 32 and on first insulating layer 31. Alternately, etch stop insulating sidewall spacers 33a and 33b are formed as by removing a portion of etch stop insulating interlayer 37. Second or upper insulating layer 35 is formed on conductive wiring 32 and on etch stop insulating interlayer 37, or on conductive wiring 32 and etch stop insulating sidewall spacers 33a and 33b and substrate 31. Conductive wiring 32 is conventional and may comprise a composite layer as indicated by phantom line 32a. Through-hole 34 is formed between the first and second insulating layers 31 and 35 to expose both conductive wiring 32 and etch stop insulating interlayer 37 or etch stop insulating sidewall spacer 33a. Through-hole 34 is then filled with conductive material 38 to form conductive via 39. The entire bottom surface of conductive via 39 is in direct contact with conductive wiring 32 and with etch stop insulating interlayer 37 or etch stop insulating sidewall spacer 33a.

With continued reference to FIG. 3, by providing etch stop insulating interlayer 37 or etch stop insulating sidewall spacer 33a in direct contact with the bottom surface of the conductive via, the amount and/or size of conductive wiring 32 can be reduced, thereby providing additional space for increasing densification. In addition, the reduction in conductive wiring afforded by the present invention simplifies design and layout, enables the use of smaller chips, reduces cost and increases the speed of production. By virtue of providing etch stop insulating interlayer 37 or etch stop insulating sidewall spacer 33a, a conductive material 38 filling through-hole 34 does not penetrate through to semiconductor substrate 36 causing a short which would otherwise occur by simply reducing the amount of conductive wiring 32 to form a negative enclosure as in FIGS. 1A and 1B.

In conducting the claimed invention, materials and manipulative steps conventionally employed in the production of semiconductor devices are employed. The semiconductor substrate typically comprises silicon, and the insulating layers, including the first (lower) and second (upper) insulating layers comprise conventional insulating materials, such as silicon dioxide and silicon oxynitride. The etch stop insulating interlayer and etch stop insulating sidewall spacers can comprise any conventional etch stop material. However, the etch stop insulating material chosen is different from the second (upper) insulating layer. For example, suitable etch stop insulating materials include nitrides, such as silicon nitride, oxides, such as silicon oxide, and oxynitrides, such as silicon oxynitride, which can be deposited by chemical vapor deposition. Suitable etch stop materials also include spin on glass, polyimides, and other polymeric materials.

The conductive wiring comprises conductive material conventionally employed in the semiconductor industry for that purpose. Preferably, the conductive wiring is formed by a material selected from the group consisting of aluminum, aluminum alloys, copper, copper alloys, tungsten or polysilicon. In another preferred embodiment, the conductive wiring is a composite structure comprising a lower layer of titanium or titanium nitride, an intermediate layer of aluminum or an aluminum alloy, and an upper layer of titanium or titanium nitride.

The conductive material employed to form the conductive via comprises conventional materials typically employed in forming conductive vias in the semiconductor industry. Preferably, the conductive material in the via is a composite structure, as indicated by phantom line 38a in FIG. 3, comprising a first layer of a refractory material, such as titanium, titanium-tungsten or titanium nitride, which acts as an adhesion promoter, and a second layer of tungsten or aluminum.

In practicing the present invention, the through-hole is formed employing conventional photolithographic and etching techniques. It has been found advantageous to employ an etch stop insulating material having a selectivity of greater than about 1:1, preferably greater than about 3:1, with respect to the insulating material.

After formation of the conductive via, the patterned surface is planarized in any conventional manner. Suitable planarization techniques include etching back and, preferably, chemical-mechanical polishing (CMP). CMP is disclosed in, for example, Salugsugan, U.S. Pat. No. 5,245,794; Beyer et al., U.S. Pat. No. 4,944,836 and Youmans, U.S. Pat. No. 3,911,562. U.S. Pat. Nos. 4,193,226 and 4,811,522 to Gill, Jr. and U.S. Pat. No. 3,841,031 to Walsh relate to CMP apparatus. After planarization, a conductive wiring pattern is formed in a conventional manner.

Basically, in employing a conventional CMP apparatus, patterned wafers to be polished are mounted on a carrier assembly which is placed on the CMP apparatus. A polishing pad is adapted to engage the wafers carried by the carrier assembly. A cleaning agent, typically a slurry, is dripped onto the pad continuously during the polishing operation while pressure is applied to the wafer via the carrier assembly.

By the present technique, the amount of material employed in and/or the size of conductive wiring can be significantly reduced, thereby simplifying the design of a semiconductor device, providing greater flexibility, increasing circuit density, reducing chip size, lower cost and increase speed. Advantageously, the conductive wiring comprises a plurality of conductive lines separated by an inter-wiring distance of less than 1 micron.

Figure 4A:
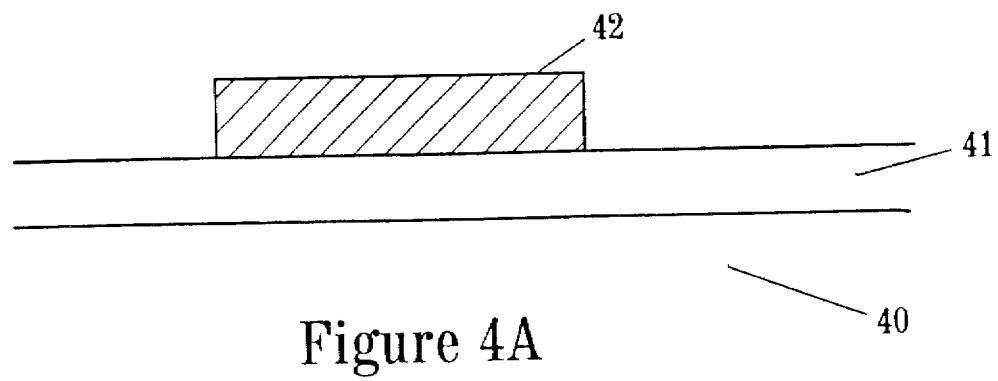
FIGS. 4A through 4D illustrate sequential manipulative steps of a method in accordance with the present invention.
Figure 4B:
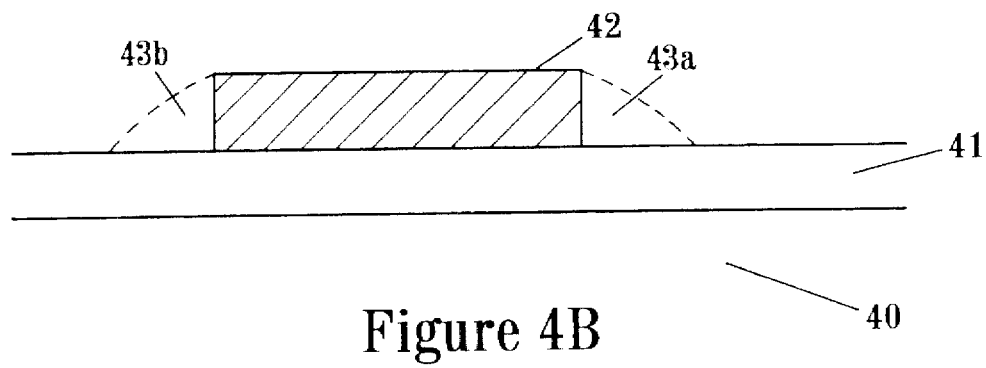
Figure 4C:
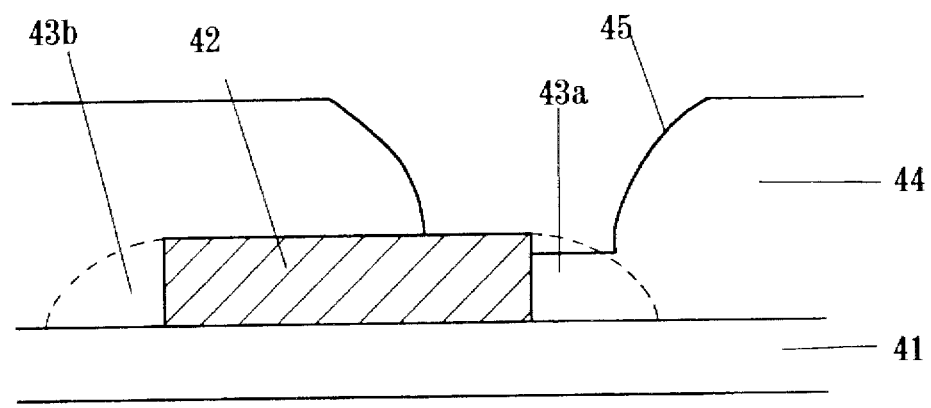

In a preferred embodiment, the interconnection structure of the present invention is formed by a method comprising a series of manipulative steps illustrated in FIGS. 4A through 4D. As shown in FIG. 4A, a first or lower insulating layer 41 is formed on substrate 40 and a conductive pattern comprising conductive wiring 42 is formed on first insulating layer 41. An etch stop insulating layer is formed on conductive wiring 42 and first insulating layer 41, and etched back to provide the intermediate structure depicted in FIG. 4B comprising conductive wiring 42 and etch stop insulating sidewall spacers 43a and 43b extending from the sidewalls of conductive wiring 42 to first insulating layer 41. As shown in FIG. 4C, a second or upper insulating layer 44 is formed on conductive wiring 42, etch stop insulating sidewall spacers 43a and 43b and first insulating layer 41. Subsequently, a through-hole 45 is formed exposing both conductive wiring 42 and etch stop insulating sidewall spacer 43a so that the entire bottom portion of through-hole 45 is occupied by conductive wiring 42 and etch stop insulating sidewall spacer 43a.

Figure 4D:
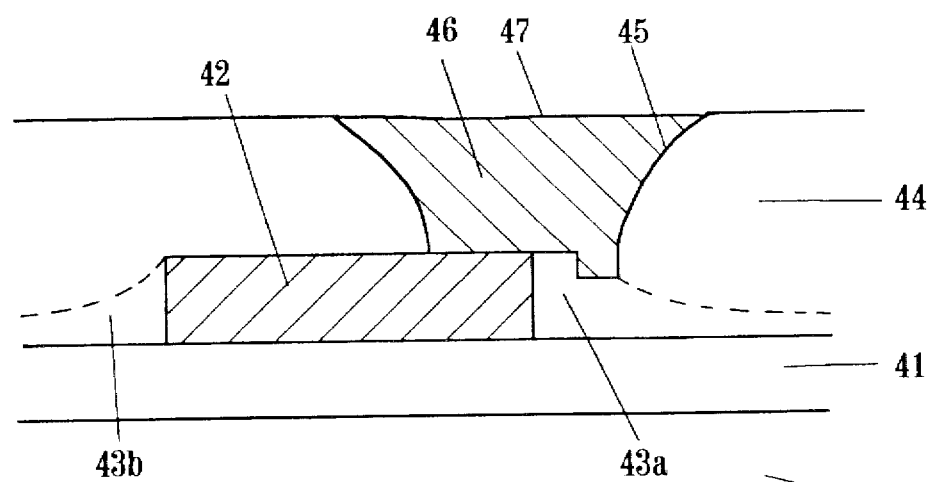

As shown in FIG. 4D, through-hole 45 is filled with conductive material 46 to form conductive via 47. The entire bottom surface of conductive via 47 is in direct contact with both conductive wiring 42 and etch stop insulating sidewall spacer 43a. The fraction of the bottom surface of conductive via 47 in direct contact with conductive wiring 42 can be easily optimized in order to provide effective interconnection and minimize the amount and/or size of conductive wiring 42, thereby providing additional chip area for increased densification. Generally, about 25 to about 95 percent, preferably about 50 to about 90 percent of the bottom surface of the conductive via is in direct contact with conductive wiring. By virtue of etch stop insulating sidewall 43a, conductive material 46 does not penetrate through to substrate 40 causing a short.

In accordance with the present invention, a negative enclosure is provided so that the bottom surface of a conductive via is in direct contact with both conductive wiring and an etch stop insulating material, thereby reducing the amount of and/or dimensions of the conductive wiring and, hence, conserving precious real estate on a semiconductor chip. The present invention advantageously simplifies the design and layout of a semiconductor device, enables increased densification and, hence, smaller chips, mat a lower cost and high rate of production.

Only the preferred embodiment of the invention and but a few examples of its versatility are shown and described in the present invention. It is to be understood that the invention is capable of use in various other combinations and environments and is capable of changes or modifications within the scope of the inventive concept as expressed herein.

I claim:

1. A multi-level semiconductor device, comprising:
   a substrate;
   a plurality of insulating layers forming levels on the substrate;
   an upper conductive wiring pattern on an upper level and a lower conductive wiring pattern on a lower level and on a first insulating layer having an upper surface, the lower conductive wiring pattern having sidewalls extending in a substantially vertical direction from the upper surface of the first insulating layer; and
   at least one conductive via comprising a through-hole filled with metal electrically connecting the upper conductive wiring pattern to the lower conductive wiring pattern, the conductive via comprising a bottom surface and extending through a second insulating layer to the lower conductive wiring pattern in direct contact with the second insulating layer; wherein the bottom surface of the conductive via is in direct contact with the lower conductive wiring pattern and with an etch stop insulating material different from the second insulating layer, and the etch stop insulating material extends from the upper surface of the first insulating layer in contact with the substantially vertical side surfaces of the lower conductive wiring pattern.

2. The multi-level semiconductor device according to claim 1, wherein the entire bottom surface of the conductive via is in direct contact with the lower conductive wiring pattern and with the etch stop insulating material.

3. The multi-level semiconductor device according to claim 2, wherein about 25 to about 95 percent of the bottom surface of the conductive via is in direct contact with the lower conductive wiring pattern.

4. The multi-level semiconductor device according to claim 3, wherein about 50 to about 90 percent of the bottom surface of the conductive via is in direct contact with the lower conductive wiring pattern.

5. The multi-level semiconductor device according to claim 1, wherein the conductive wiring comprises a material selected from the group consisting of refractory material, titanium, titanium-tungsten, titanium nitride, aluminum, aluminum alloys, copper, copper alloys, tungsten and polysilicon.

6. The multi-level semiconductor device according to claim 1, wherein the at least one of the conductive wiring patterns comprises a composite structure.

7. The multi-level semiconductor device according to claim 1, wherein the at least one of conductive wiring patterns comprises at least one of aluminum, copper, aluminum alloys and copper alloys.

8. The multi-level semiconductor device according to claim 7, wherein the conductive material in the via comprises a composite structure comprising a first layer of refractory material, and a second layer of at least one of tungsten, aluminum and aluminum alloys.

9. The multi-level semiconductor device according to claim 8, wherein the refractory material is selected from the group consisting of titanium, titanium-tungsten and titanium nitride.

10. The multi-level semiconductor device according to claim 1, wherein the etch stop insulating material is different from the upper level and selected from the group consisting of nitrides, oxides, oxynitrides, polyimides, spun on glass and polymeric materials.

11. The multi-level semiconductor device according to claim 10, wherein the etch stop insulating material is deposited by chemical vapor deposition or spinning.

\* \* \* \* \*